United States Patent [19]

Havens

[11] 4,053,854
[45] Oct. 11, 1977

[54] Q SWITCHING MICROWAVE OSCILLATOR

[75] Inventor: Richard Calvin Havens, Scottsdale, Ariz.

[73] Assignee: Motorola Inc., Schaumburg, Ill.

[21] Appl. No.: 693,824

[22] Filed: June 7, 1976

[51] Int. Cl.² ............................................. H03B 7/14
[52] U.S. Cl. .................................. 331/101; 325/105; 331/107 R
[58] Field of Search ................ 331/99, 100, 101, 102, 331/95, 107 R, 107 G, 107 T; 325/105

[56] References Cited

U.S. PATENT DOCUMENTS

| | | | |
|---|---|---|---|
| 3,401,355 | 9/1968 | Kafitz ................................. | 331/107 |
| 3,509,478 | 4/1970 | Thim .................................. | 331/101 |
| 3,534,293 | 10/1970 | Harkless ............................. | 331/101 |
| 3,559,097 | 1/1971 | Chang et al. ...................... | 331/101 |
| 3,593,192 | 7/1971 | Nagano et al. ................... | 331/107 R |
| 3,599,118 | 8/1971 | Large ................................. | 331/101 |
| 3,626,327 | 12/1971 | Luchsinger et al. ............. | 331/107 R |
| 3,913,035 | 10/1975 | Havens .............................. | 331/107 R |
| 3,919,667 | 11/1975 | Yu et al. ............................ | 331/107 R |

*Primary Examiner*—John Kominski
*Attorney, Agent, or Firm*—Eugene A. Parsons

[57] ABSTRACT

A housing defining a first cavity forming a transmission line and a negative impedance semiconductor device terminating one end of the transmission line in a negative impedance, the housing further defining a second cavity resonant at a predetermined frequency and a means of electromagnetically coupling between the transmission line and the second cavity to couple energy therebetween, a reactive element formed between said negative impedance semiconductor device and the housing to provide a shunt susceptance to parallel resonate with the susceptance of the semiconductor device at the desired frequency and bias, and load isolator connected to the opposite end of the transmission line for transmitting RF output pulses to the RF load and for applying a DC bias thereto normally at a first level and periodically reduced to a second level for a short duration, said semiconductor device operating as a series resonant circuit with the DC bias at the first level to cause energy to be stored in the resonant cavity and operating in parallel resonance with the reactive element when the DC bias is at the second level to lower the Q of the resonant cavity and allow energy to flow from the resonant cavity to the RF load in a short duration, high peak power pulse.

14 Claims, 3 Drawing Figures

– 4,053,854 –

Q SWITCHING MICROWAVE OSCILLATOR

BACKGROUND OF THE INVENTION

The present invention pertains to a microwave oscillator, and more particularly to a solid state microwave oscillator useful in numerous military, space and consumer systems, such as transponders, fuses, radars, ECM, and the like. In general, solid state microwave oscillators utilize a negative resistance diode, such as IMPATT diodes, Gunn-effect diodes, tunnel diodes, LSA diodes, etc. These negative resistance diodes are generally of two types, that is continuous wave (CW) or pulsed. In general the pulsed diodes are capable of higher peak power than the CW diodes but are limited to a certain percentage duty factor. This limits the average power of the pulsed diodes to generally less than the power available from CW diodes. If higher peak power is desired than can generally be obtained from available pulsed diodes, it is presently necessary to use high power RF tubes, such as magnetrons or klystrons. These high power RF tubes are heavy, large, complicated, expensive and generally require very high voltages.

SUMMARY OF THE INVENTION

In the present invention a resonant cavity with no output ports is electrically coupled to a transmission line terminated at one end by a negative impedance semiconductor device and at the other end by a circulator/load-isolator which provides a broadband 50 ohm load for preventing out of band oscillations and for directing the high peak power output pulses generated by the oscillator to the RF load. It also provides a means of injecting interrupted DC bias to operate the oscillator. The negative impedance semiconductor device is, for example, a negative resistance diode, and is operated in two distinctly different states. In the first state the semiconductor is biased for series resonance and maximum CW power output to the high loaded Q resonant cavity. In the second state the diode is biased at another, generally lower, voltage or current where antiresonance at the same frequency can be achieved by the addition of a shunt susceptance. The semiconductor may or may not be still biased in the negative resistance region so that the diode will dissipate little or no RF power in addition to providing a very high impedance at antiresonance which reduces the loaded Q of the resonant cavity and dumps the energy into the output load in a high peak power pulse.

It is an object of the present invention to provide a new and improved pulsed microwave oscillator.

It is a further object of the present invention to provide a new and improved microwave oscillator which utilizes CW or pulsed negative impedance semiconductor devices to provide much higher peak power pulses of output power than could be obtained by known art heretofore.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
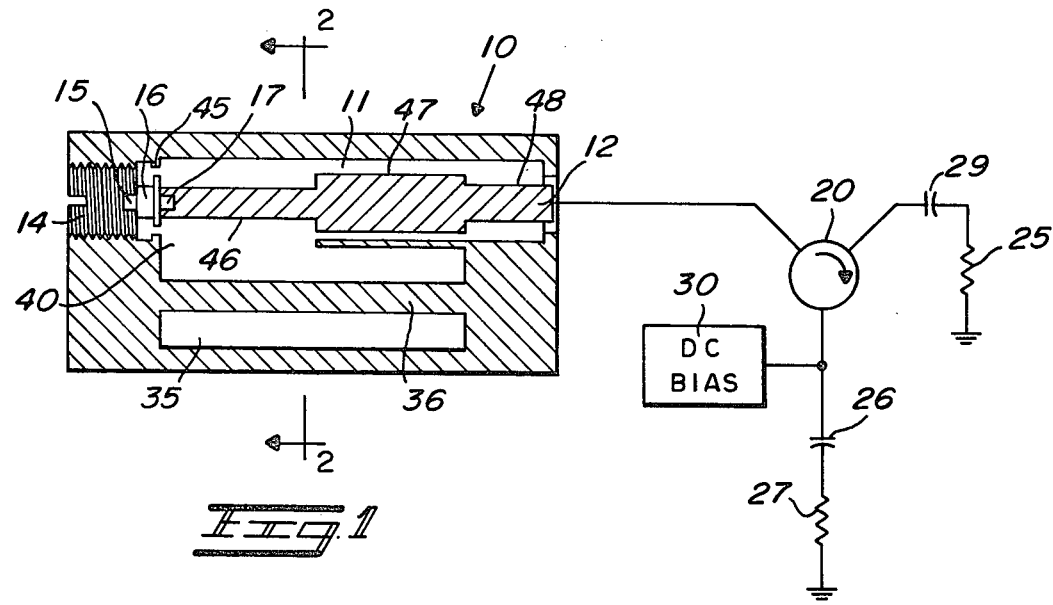
FIG. 1 is a sectional view along the longitudinal axis of a microwave oscillator embodying the present invention.
Figure 2:
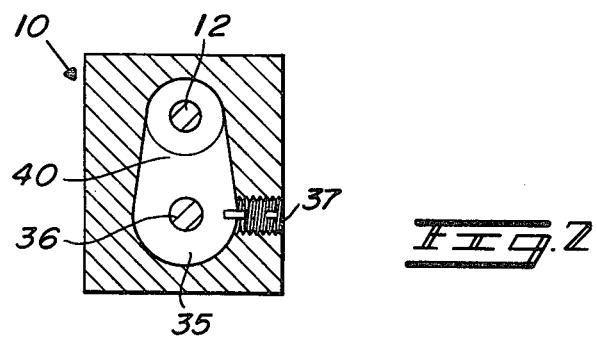
FIG. 2 is a sectional view as seen from the line 2—2 in FIG. 1.

Referring specifically to FIGS. 1 and 2, a housing, generally designated 10, is illustrated. The housing 10 may be formed of electrically conductive metal, or the cavities to be described can be coated with an electrically conductive metal to provide the proper operation of the circuitry. The housing 10 defines a first elongated cavity 11 which extends longitudinal through the housing 10 and is in the shape of a cylinder having a circular cross section. A generally circular center conductor 12 (with different diameters to be explained presently) is coaxially mounted within the cavity 11 so as to form a transmission line. A plug 14 is threadedly engaged in the housing 10 at one end of the cavity 11 to seal the cavity and to receive one terminal 15 of a negative impedance semiconductor device 16 therein. A second terminal 17 of the semiconductor device 16 is fixedly engaged in the center conductor 12 and holds the one end thereof fixedly in place. The negative impedance semiconductor device may be a transistor or any of the negative resistance diodes commonly used in microwave oscillators. The semiconductor device terminates the one end of the transmission line in a negative impedance.

The opposite end of the transmission line is open and has an external circulator/load isolator 20 attached thereto. The circulator/load isolator has attached thereto an output RF load 25 which in this embodiment is shown as a resistor 25 for simplicity, DC blocking capacitors 26 and 29, a broadband (50 ohm) load impedance 27, and DC biasing means 30. The DC biasing means 30 is illustrated in block form since any desired means of providing the bias will suffice and those skilled in the art may devise a variety of means to provide the desired bias. The purpose of the circulator/load isolator 20 is to provide a broadband load 27 which will prevent out-of-band spurious oscillations and to simultaneously provide a means for introducing the bias without affecting the RF termination seen by the negative impedance device.

The housing 10 also defines a second cavity 35 which, in this embodiment is illustrated as a coaxial cavity having a center conductor 36 extending longitudinally through the cavity 35 and formed as an integral part of the housing 10. The cavity 35 is resonant at the desired frequency of the oscillator and, in this embodiment, is formed one-half wavelength long. A sapphire tuning rod 37 is threadedly engaged in an opening in the cavity 35 for tuning the cavity to the desired frequency. The resonant cavity 35 is designed to store electromagnetic RF energy produced by the negative resistance semiconductor device previously described and the amount of energy stored is a function of the Q of the resonant cavity 35. Therefore, the resonant cavity 35 may be formed in any desired configuration to provide the desired Q and may, for example, be wave guide, transmission line, coaxial cavities, etc. and the length thereof may be adjusted to provide the desired Q while maintaining the cavity resonant at the desired frequency.

An opening 40 is defined in the housing 10 between the transmission line and the resonant cavity 35 for coupling electromagnetic energy therebetween. In the present embodiment, the opening 40 is approximately one-quarter wavelength long at the desired frequency and the longitudinal axis of the transmission line, the resonant cavity 35 and the opening 40 are parallel and spaced apart within the housing 10. The opening 40, or the coupling means, should be constructed to match the impedance of the resonant cavity 35 to the impedance of the semiconductor device 16. It should be understood that many other means of providing the desired coupling between the transmission line and the resonant cavity may be provided by those skilled in the art and the coupling shown is utilized because of its simplicity and because it is sufficient to provide the necessary coupling in most cases.

Capacitance means are formed between the semiconductor device 16 and the housing 10, in the present embodiment, by forming an annular ring 45 as an integral portion of the housing 10 so as to extend inwardly into the cavity 11 and coaxially encircle the semiconductor device 16. The capacitance means 45 provides a shunt susceptance which parallel resonates with the susceptance of the negative impedance semiconductor device 16 at the desired frequency when the DC bias supplied to the oscillator is lowered to a predetermined or second value. At the normal or first DC bias the capacitance means 45 does not substantially effect the negative impedance device and a series resonant circuit is formed which produces oscillations within the oscillator at the desired frequency.

The center conductor 12 is formed with a first diameter, designated 46, for a length of approximately one quarter wavelength extending from adjacent the semiconductor device 16 to adjacent the opposite side of the opening 40. The center conductor 12 has a second diameter, designated 47, for a length of approximately one quarter wavelength extending from the end of the diameter 46 to adjacent the end of the cavity 35. The remainder of the length of the center conductor 12 has a diameter, designated 48, which gives the transmission line a characteristic impedance of approximately 50 ohms. The diameter 46 is smaller than the diameter 48 and provides a characteristic impedance higher than 50 ohms. The diameter 47 is larger than the diameter 48 and provides a characteristic impedance lower than 50 ohms. The one quarter wavelength portions of transmission line form impedance transformers which are used to adjust the coupling between the transmission line and the coaxial cavity 35 to the proper value when the negative impedance semiconductor device 16 is biased to its second level. This adjusts the loaded Q of the cavity 35 and hence the level of RF power coupled out of the cavity 35 to the load 25 during the output pulse portion of the bias cycle. It will of course be understood that different types of impedance transformers might be utilized, depending upon the load used and the resonant cavity to be matched thereto, and the present embodiment is simply illustrative of one method. In special instances, the center conductor may have a constant diameter and a constant characteristic impedance, such as 50 ohms. In this case the impedance transformer provides a 1 to 1 ratio.

While FIG. 1 shows a shunt capacitance to accomplish the necessary antiresonance, it will be recognized by those skilled in the art that a multitude of different means may be envisioned for accomplishing this requirement. Depending on the type of negative resistance semiconductor used, the shunt reactance required might be either capacitive or inductive. Many different lumped or distributed circuits can be envisioned to accomplish this. However, any method used must retain the DC open between terminal 17 of the diode and the ground or housing 10 so that the DC bias voltage will not be shorted.

Figure 3:
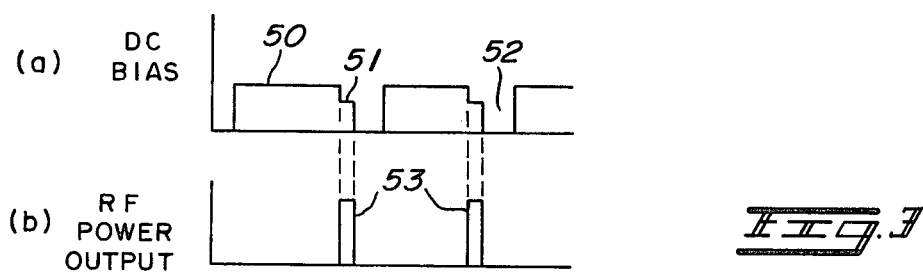
FIG. 3 illustrates waveforms available at designated points in the apparatus of FIG. 1.

In the operation of the microwave oscillator illustrated in FIGS. 1 and 2 and described above, a first, or high level, of DC bias is applied to the oscillator through the circulator/load isolator 20 by the bias means 30. This high level of bias is illustrated in FIG. 3, waveform (a), and is designated 50. While the first or high level of DC bias is applied to the oscillator the semiconductor device 16 operates as a series resonant circuit, terminating the transmission line in a negative impedance which causes oscillations that are coupled essentially to the resonant cavity 35. Because the coupling to the resonant cavity is optimum, the loaded Q of the resonant cavity 35 is relatively high and electromagnetic energy is stored therein, with the amount of energy capable of being stored a function of the unloaded Q of the resonant cavity. That is, as the unloaded Q of the resonant cavity 35 is increased, through increasing the size or shape thereof, the amount of energy capable of being stored therein increases. To facilitate using the resonant cavity selected, the opening 40, or coupling means, is adjusted so that the parallel combination of the impedance of the resonant cavity 35 and the output load impedance 25 is equal to the negative impedance of the diode during the CW operation. With the opening 40 adjusted as described, in most cases all but a very small percentage of the microwave electromagnetic energy generated can be transmitted to the cavity. If the first or high level DC bias 50 is applied to the oscillator for a sufficient time and the cavity is properly matched to the diode, the stored microwave energy in the resonant cavity will approach Q divided by 2 times the CW input energy per cycle, where Q is the unloaded Q of the resonant cavity 35.

After a predetermined time period, the DC bias is changed or lowered quickly to a second level for a short period of time, illustrated as negative going pulse 51 in waveform A of FIG. 3. Switching the DC bias applied to the semiconductor device 16 switches the semiconductor device into antiresonance. That is, the capacitance means 45 provides a shunt susceptance which parallel resonates with the susceptance of the semiconductor device at the frequency of the oscillator so that a very high impedance is provided to terminate transmission line 12. Switching the semiconductor device 16 into the antiresonance mode of operation causes the coupling between the transmission line 12 and cavity 35 to be greatly increased causing the external Q of the resonant cavity 35 to be reduced and the stored energy therein is quickly transmitted to the output load impedance 25. The semiconductor device 16 is still biased in or near the negative resistance region so that it will not dissipate RF power and, therefore, the high levels of RF output power do not pass through the semiconductor device 16.

Thus, a high peak power RF output pulse, illustrated in waveform (b) of FIG. 3 and designated 53, is produced each time the DC bias is lowered. The pulse width must be inversely proportional to the peak power output so that high peak power out requires short pulse widths. In this manner, RF energy is stored over a long period of time and released in a short period of time, and hence a pulsed solid state transmitter is derived from a negative impedance semiconductor device which can have considerably higher peak power output (up to 1000 times or higher) than the normal power output capability of the semiconductor device. Since the time between the pulse 53 is longer (in this embodiment) than the time required for the electromagnetic energy to build up to a maximum level in the cavity 35, bias energy is not applied to the oscillator for some period of time, designated 52, after each output pulse 53. This makes the oscillator time efficient since the application of energy for the additional time would simply be wasted.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A microwave Q switching oscillator comprising:
   a. a transmission line;
   b. a negative impedance device connected at one end of said transmission line for terminating said transmission line in a negative impedance and generating RF energy at a desired frequency;
   c. the opposite end of said transmission line forming an output for generated pulses of RF energy;
   d. a cavity tuned to be resonant at the desired frequency and capable of storing a predetermined amount of RF energy;
   e. coupling means for coupling RF energy at the desired frequency between said transmission line and said cavity;
   f. means coupled to the negative impedance device for receiving thereon a bias normally at a first level and periodically changed to a second level.
   g. susceptance means cooperating with said negative impedance device to tune said device to an antiresonant mode of operation when the second level of bias is applied thereto; and
   h. said negative impedance device operating in a resonant mode when the bias is at the first level to cause RF energy to be stored in said resonant cavity and operating in the antiresonant mode when the second level of bias is applied to change the Q of said resonant cavity and allow RF energy to flow from said resonant cavity to the output of said transmission line at a different rate than that at which it was stored.

2. A microwave Q switching oscillator as claimed in claim 1 including means for adjusting the RF coupling between said transmission line and said resonant cavity to a desired amount when said negative impedance device is biased at the second level.

3. A microwave Q switching oscillator as claimed in claim 2 wherein the means for adjusting the RF coupling includes an impedance transformer in the transmission line.

4. A microwave Q switching oscillator as claimed in claim 1 wherein the means for receiving a bias thereon is DC coupled to the opposite end of the transmission line.

5. A microwave Q switching oscillator as claimed in claim 4 wherein the means for receiving a bias includes apparatus for separating the RF energy at the output of the transmission line and the bias applied thereto.

6. A microwave Q switching oscillator as claimed in claim 5 wherein the means for receiving a bias includes circulator/load isolator apparatus having a first port connected to the output of the transmission line, a second port for receiving bias thereon and a third port for having an RF load connected thereto, said second port absorbing RF energy reflected from said third port.

7. A microwave oscillator comprising:
   a. a housing defining a first elongated cavity, a second cavity resonant at a desired frequency and which stores a predetermined amount of electrical energy therein, and an opening between said first cavity and said second cavity;
   b. an elongated center conductor coaxially mounted in said first cavity to form a transmission line;
   c. a negative impedance device connected to one end of said center conductor for terminating one end of the transmission line in a negative impedance;
   d. said opening defined in said housing coupling said resonant second cavity to the transmission line so that the impedance of said second cavity is approximately matched to the impedance of said negative impedance device at the desired frequency;
   e. susceptance means formed between said negative impedance semiconduct device and said housing and providing a shunt susceptance to parallel resonate with the susceptance of the negative impedance device at the desired frequency; and
   f. output means connected to the other end of the transmission line and having an input for receiving thereon a DC bias normally at a first level and periodically reduced to a second level for a short duration, said negative impedance device operating as a series resonant circuit when the DC bias is at the first level to cause energy to be stored in the resonant cavity and operating in parallel resonance with said susceptance means when the DC bias is at the second level to change the Q of the resonant cavity to allow energy to flow from the resonant cavity to said output means.

8. A microwave oscillator as claimed in claim 7 wherein the negative impedance device is a negative resistance diode mounted between the one end of the center conductor and the housing.

9. A microwave oscillator as claimed in claim 8 wherein the diode is generally circular in cross section and the susceptance means includes capacitance means formed as an annular ring affixed to the housing so as to project inwardly into the first elongated cavity and coaxially encircle the diode in spaced relation therefrom.

10. A microwave oscillator as claimed in claim 9 wherein the second cavity is approximately a half wavelength long at the desired frequency.

11. A microwave oscillator as claimed in claim 7 wherein the opening between the first and second cavities is approximately one quarter wavelength long.

12. A microwave oscillator as claimed in claim 7 including in addition an elongated center conductor coaxially mounted in the second elongated cavity to form a coaxial resonant cavity.

13. A microwave oscillator as claimed in claim 7 wherein the negative impedance device is a CW negative resistance diode.

14. A microwave oscillator as claimed in claim 7 wherein the negative impedance device is a pulsed negative resistance diode.

* * * * *